United States Patent
Ogino

(10) Patent No.: US 8,134,686 B2
(45) Date of Patent: Mar. 13, 2012

(54) IMMERSION EXPOSURE APPARATUS AND DEVICE MANUFACTURING METHOD

(75) Inventor: Kaoru Ogino, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 230 days.

(21) Appl. No.: 12/212,190

(22) Filed: Sep. 17, 2008

(65) Prior Publication Data

US 2009/0091721 A1    Apr. 9, 2009

(30) Foreign Application Priority Data

Oct. 5, 2007    (JP) .................... 2007-262731

(51) Int. Cl.
G03B 27/42    (2006.01)
G03B 27/52    (2006.01)

(52) U.S. Cl. .......................................... 355/53

(58) Field of Classification Search .............. 355/30, 355/53, 68–69
See application file for complete search history.

(56) References Cited

U.S. PATENT DOCUMENTS

| | | | |
|---|---|---|---|
| 7,170,583 B2 * | 1/2007 | Van Der Meulen et al. | 355/53 |
| 7,505,115 B2 * | 3/2009 | Magome et al. | 355/53 |
| 7,847,916 B2 * | 12/2010 | Hara et al. | 355/30 |
| 2006/0132737 A1 | 6/2006 | Magome et al. | 355/53 |
| 2006/0146305 A1 | 7/2006 | Magome et al. | 355/53 |
| 2006/0209280 A1 | 9/2006 | Makita et al. | 355/53 |
| 2007/0159609 A1 * | 7/2007 | Takaiwa et al. | 355/53 |
| 2007/0252960 A1 * | 11/2007 | Kida | 355/30 |

FOREIGN PATENT DOCUMENTS

| | | |
|---|---|---|
| JP | 2005-79480 | 3/2005 |
| JP | 2005-268742 | 9/2005 |
| JP | 2006-179761 | 7/2006 |

* cited by examiner

*Primary Examiner* — Hung Henry Nguyen

(74) *Attorney, Agent, or Firm* — Fitzpatrick, Cella, Harper & Scinto

(57) ABSTRACT

An exposure apparatus includes a projection optical system configured to project a pattern of an original onto a substrate via a liquid, to expose the substrate to light, a stage mechanism including a stage configured to hold the substrate, an immersion unit configured to supply a liquid to a gap between the substrate or the stage and the projection optical system and to recover the liquid from the gap, and a controller configured to shut off power supply to the immersion unit after determining that recovery of the liquid by the immersion unit is completed up to a target level, if a power-off request is received.

7 Claims, 4 Drawing Sheets

IMMERSION EXPOSURE APPARATUS AND DEVICE MANUFACTURING METHOD

This application claims the benefit of Japanese Patent Application No. 2007-262731, filed Oct. 5, 2007, which is hereby incorporated by reference herein in its entirety.

BACKGROUND OF THE INVENTION

1. Field of the Invention

The present invention relates to an exposure apparatus that projects an original pattern onto a substrate via a projection optical system and a liquid, and exposes the substrate to light, and relates to a method of manufacturing a device using the apparatus.

2. Description of the Related Art

With advances in the miniaturization of semiconductor devices, exposure light sources used have shifted from high-pressure mercury lamps (for g and i lines) to KrF excimer lasers and ArF excimer lasers, that is, light sources that emit light having shorter wavelengths. In order to obtain higher resolutions, the NAs (Numerical Apertures) of projection optical systems need to be increased. This leads to the tendency toward smaller depths of focus. The relationship between them can be generally expressed by:

(resolution)=$k_1(\lambda/NA)$ (depth of focus)=$\pm k_2(\lambda/NA^2)$, where $\lambda$ is the wavelength of the exposure light, NA is the numerical aperture of a projection lens, and $k_1$ and $k_2$ are coefficients dependent on processes.

As a technique for higher resolutions and larger depths of focus, a technique using a phase shift mask or modified illumination has been studied and put into practice. As another technique for higher resolutions and larger depths of focus, an immersion exposure technique is known. The immersion exposure technique is a technique of exposing a substrate to light via a liquid having a high refractive index between the final surface of a projection optical system and a substrate (image surface).

If the liquid supplied in the space between the final surface of the projection optical system and the image surface leaks, due to some reason, the leakage may affect electronic devices, mechanisms, and the like, in the exposure apparatus. The occurrence of leakage of the liquid requires a long period of maintenance time for restoration, resulting in a deterioration in productivity. In particular, if the power supplied to the exposure apparatus is shut off at the time of an emergency, even during the operation of the apparatus, the liquid remains on a substrate or the substrate stage, and may leak thereafter.

Japanese Patent Laid-Open No. 2005-079480 discloses a technique of tilting a substrate stage to make a liquid flow into a liquid recovery groove formed in advance in the stage at the time of power failure. Japanese Patent Laid-Open No. 2005-268742 discloses a technique of preventing adverse effects on other peripheral electronic devices, and the like, by stopping the supply of a liquid and specifying a leakage portion by using a leakage detection mechanism at the time of an emergency, for example, a power failure. Japanese Patent Laid-Open No. 2006-179761 discloses a technique using a plurality of power supply systems.

The techniques disclosed in each of Japanese Patent Laid-Open Nos. 2005-079480, 2005-268742, and 2006-179761 can be understood to be a technique of preventing the leakage of a liquid when the power supplied to an immersion exposure apparatus is shut off. The techniques disclosed in each of Japanese Patent Laid-Open Nos. 2005-079480, 2005-268742, and 2006-179761 do not propose any specific sequence by which the supply of power is shut off upon reception of a power-off request. Furthermore, the techniques disclosed in each of Japanese Patent Laid-Open Nos. 2005-079480, 2005-268742, and 2006-179761 do not propose to quickly recover the liquid on a substrate or the substrate stage when the supply of power is shut off. Moreover, the techniques disclosed in each of Japanese Patent Laid-Open Nos. 2005-079480, 2005-268742, and 2006-179761 do not propose to control recovery of the liquid by a method corresponding to trouble that has occurred in a power supply system.

SUMMARY OF THE INVENTION

It is an exemplary object of the present invention to reduce an amount of liquid left on a substrate or a substrate stage at the time of a power-off.

According to a first aspect, the present invention provides an exposure apparatus that includes a projection optical system configured to project a pattern of an original onto a substrate, via a liquid, to expose the substrate to light, the apparatus comprising a stage mechanism that includes a stage configured to hold the substrate, an immersion unit configured to supply a liquid to a gap between the substrate or the stage and the projection optical system, and to recover the liquid from the gap, and a controller configured to shut off power supply to the immersion unit after determining that recovery of the liquid by the immersion unit is completed up to a target level, if a power-off request is received.

According to a second aspect, the present invention provides an exposure apparatus that includes a projection optical system configured to project a pattern of an original onto a substrate via a liquid to expose the substrate to light, the apparatus comprising a stage mechanism that includes a stage configured to hold the substrate, and an immersion unit configured to supply a liquid to a gap between the substrate or the stage and the projection optical system, and to recover the liquid from the gap, wherein the immersion unit includes an emergency recovery unit configured to recover the liquid from the gap at a time of an emergency, the emergency recovery unit including an emergency recovery path connected to a suction line to recover the liquid and an emergency relief valve placed in the emergency recovery path, and configured to be opened at the time of the emergency.

According to a third aspect, the present invention provides an exposure apparatus that includes a projection optical system configured to project a pattern of an original onto a substrate, via a liquid, to expose the substrate to light, the apparatus comprising a stage mechanism that includes a stage configured to hold the substrate, an immersion unit configured to supply a liquid to a gap between the substrate or the stage and the projection optical system, and to recover the liquid from the gap, and a controller configured to shut off power supply to the immersion unit after an elapse of a preset wait time, if an emergency off request occurs for the power supply.

According to a fourth aspect, the present invention provides an exposure apparatus that includes a projection optical system configured to project a pattern of an original onto a substrate via a liquid to expose the substrate to light, the apparatus comprising a stage mechanism including a stage configured to hold the substrate, and an immersion unit configured to supply a liquid to a gap between the substrate or the stage and the projection optical system, and to recover the liquid from the gap, a diagnostic unit configured to diagnose a plurality of power supply systems, and a controller, wherein one of the plurality of power supply systems is configured to supply power to a block including the immersion unit, and the controller is configured, if the diagnostic unit determines that a power supply system other than the power supply system configured to supply power to the block has a difficulty, to cause the power supply system having the difficulty to stop power supply, and to cause the power supply system configured to supply power to the block to keep the power supply until at least recovery of the liquid by the immersion unit is completed.

According to the present invention, it is possible, for example, to reduce an amount of liquid left on a substrate or a substrate stage at the time of power-off.

Further features of the present invention will become apparent from the following description of exemplary embodiments, with reference to the attached drawings.

DESCRIPTION OF THE EMBODIMENTS

The preferred embodiments of the present invention will be described below with reference to the accompanying drawings.

Figure 1:
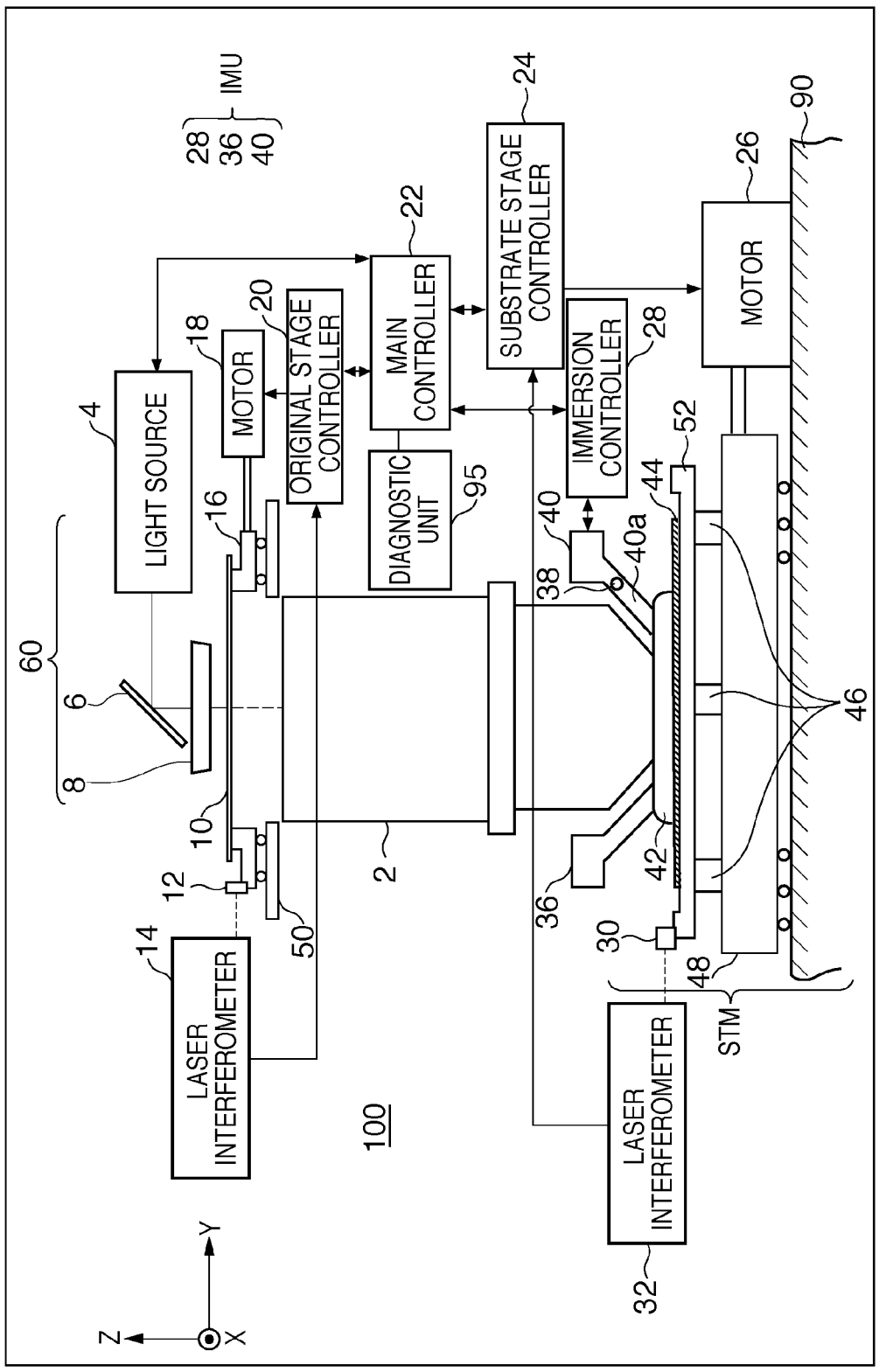
FIG. 1 is a view schematically showing the arrangement of an immersion exposure apparatus according to a preferred embodiment of the present invention.

FIG. 1 is a view schematically showing the arrangement of an immersion exposure apparatus according to a preferred embodiment of the present invention. The following exemplifies a case in which an immersion exposure apparatus is applied to a scanner. However, the present invention can also be applied to a stepper.

An immersion exposure apparatus 100 according to a preferred embodiment of the present invention is configured to project a pattern formed on an original (also called a reticle or mask) 10 onto a substrate (wafer) 44 via a projection optical system 2 and a liquid 42, and exposes the substrate 44 to light. In this case, the substrate 44 is coated with a photoresist. A latent image pattern is formed on the photoresist by exposure. The projection optical system 2 has, for example, a circular imaging field formed in a telecentric system on the object (original) side and a circular image field formed in a telecentric system on the image (substrate) side. The original 10 and the substrate 44 are scanned/driven relative to the projection optical system 2 at the time of exposure on each shot area of the substrate 44.

An illumination system 60 can comprise, for example, a light source 4, a beam expander (not shown), an optical integrator (not shown), a mirror 6, a collimator lens system 8, an illumination field stop (not shown), and a relay optical system (not shown).

As the light source 4, for example, an ArF excimer laser source, which emits pulse light having a wavelength of 193 nm, can be used. The beam expander shapes the cross-sectional shape of light emitted from the light source 4. The optical integrator is, for example, a fly-eye lens, which receives shaped light and forms a secondary light source image. The collimator lens system 8 focuses light from the secondary light source image and forms illumination light having a uniform illuminance distribution. The illumination field stop shapes the illumination light into a rectangular shape, which is longer in a direction perpendicular to the scanning direction at the time of scanning exposure. The relay optical system forms an image of the rectangular opening portion of the illumination field stop on the original 10 in cooperation with the mirror 6 and the collimator lens system 8.

An original stage 16 holds the original 10 by a vacuum suction force. The original stage 16 is driven at large strokes in a uniaxial direction at a constant velocity during scanning exposure. An original stage support 50 supports the original stage 16.

A laser interferometer 14 continuously measures the position and rotation of the original stage 16 within an x-y plane. The laser interferometer 14 applies a laser beam to a mirror (a plane mirror or corner mirror) 12 mounted on the original stage 16, and receives a laser beam reflected by the mirror 12. An original stage controller 20 controls a motor (e.g., a linear motor) 18, which drives the original stage 16 based on the x-y position measured by the laser interferometer 14.

When part of the pattern area of the original 10 is illuminated with shaped illumination light, exposure light exiting from the illuminated part of the pattern is projected and formed into an image on a photosensitive agent (photoresist) coated on the substrate 44 via the projection optical system (e.g., a ¼ reduction projection optical system) 2. The optical axis of the projection optical system 2 is positioned to be coaxial with the optical axis of the illumination system 60.

The projection optical system 2 includes a plurality of lens elements (optical elements). These lens elements can be made of two different materials, such as quartz and fluorite, which have high transmittances with respect to ultraviolet light (exposure light) having a wavelength of 193 nm. Fluorite is mainly used to form a lens element having a positive power. The space in a lens barrel, in which the lens elements of the projection optical system 2 are fixed, can be filled with nitrogen gas to suppress the absorption of exposure light by oxygen. The optical path extending form the interior of the light source 4 to the collimator lens system 8 can also be filled with nitrogen gas in the same manner. Note that the projection optical system 2 can include a mirror.

Figure 2:
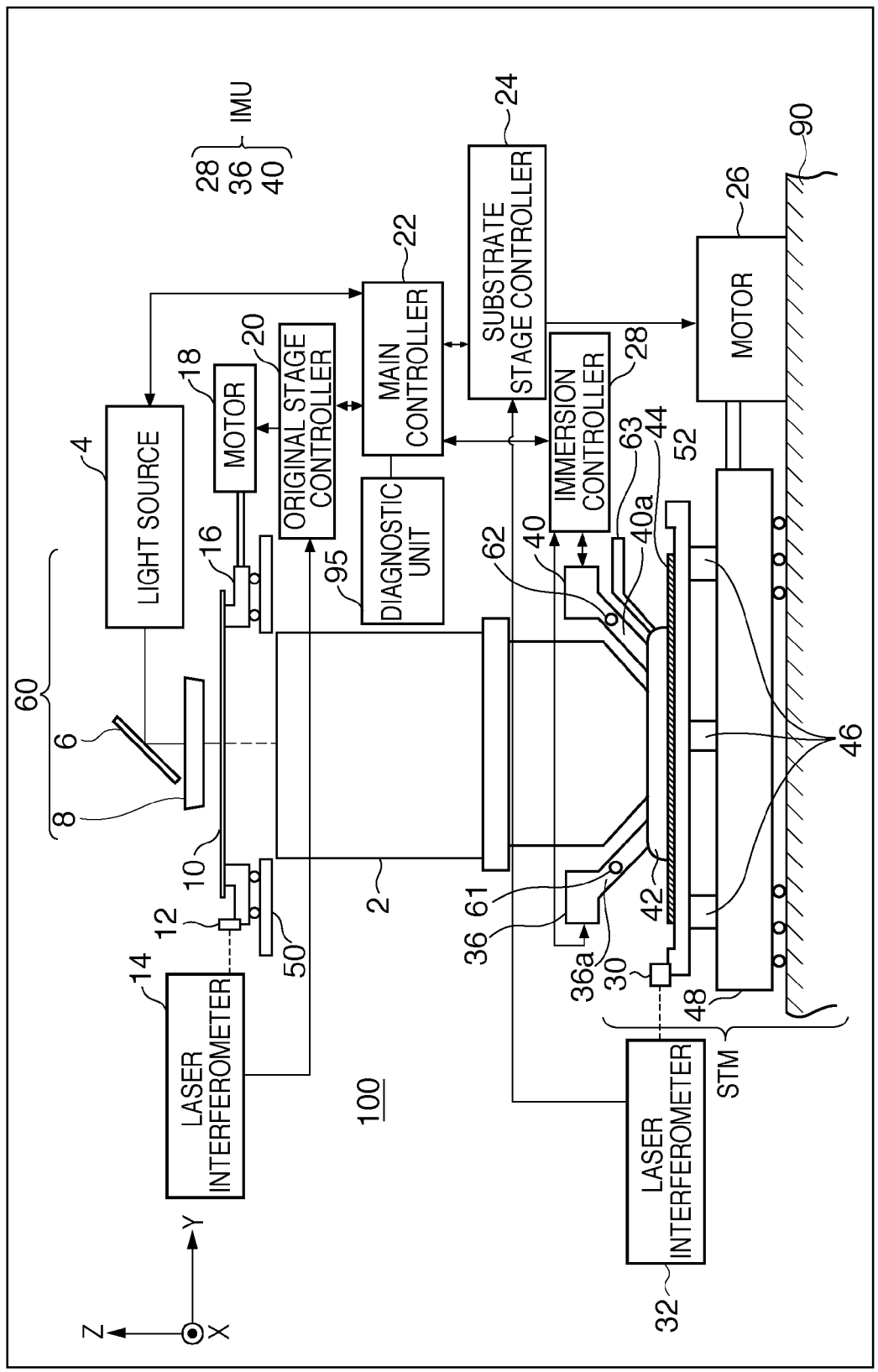
FIG. 2 is a view schematically showing the arrangement of an immersion exposure apparatus according to another preferred embodiment of the present invention.

A substrate stage mechanism STM includes a substrate stage (ZT stage) 52, which holds the substrate 44 positions or drives the substrate 44. FIG. 2 is a schematic view of the substrate stage 52 viewed from above. The substrate stage 52 comprises a substrate chuck (not shown). The substrate chuck holds the substrate 44. The substrate stage 52 adjusts the position of the substrate 44 in the z direction along the optical axis of the projection optical system 2 and the tilt of the substrate 44 with respect to the x-y plane perpendicular to the z direction. The substrate stage 52 can be mounted on an X-Y stage 48 via a plurality of (e.g., three) Z actuators 46.

The X-Y stage 48 is two-dimensionally driven in the x and y directions on a substrate stage support 90. The X-Y stage 48 can be two-dimensionally driven by a plurality of motors 26. The motors 26 each can comprise a DC motor, which rotates a feed screw and/or a linear motor, which generates driving force in a noncontact state. A substrate stage controller 24 can control the motors 26. The substrate stage controller 24 receives the position information of the substrate stage 52 in the x and y directions from a laser interferometer 32. The laser interferometer 32 applies a laser beam to a mirror 30 provided on the substrate stage 52 and receives a laser beam reflected by the mirror 30.

The liquid 42 can form a liquid film in this space between the end surface of the projection optical system 2 and the substrate 44. A pattern of the original 10 is projected onto the substrate 44 via the liquid 42, as well as the projection optical system 2.

An immersion unit IMU controls the supply of the liquid 42 into the space between the substrate 44 or the substrate stage 52, and the end surface of the projection optical system 2, and the recovery of the liquid 42 from the surface of the substrate 44 or the substrate stage 52. The immersion unit IMU can include, for example, a liquid supply unit 36, a liquid recovery unit 40, and an immersion controller 28. The liquid supply unit 36 supplies the liquid 42 into the space between the substrate 44 or the substrate stage 52 and the end surface of the projection optical system 2, in accordance with a command from the immersion controller 28. The liquid recovery unit 40 recovers the liquid 42 on the substrate 44 or the substrate stage 52 in accordance with a command from the immersion controller 28.

A main controller 22 controls the supply of power to a plurality of units (e.g., the substrate stage mechanism STM, the immersion unit IMU, and the illumination system 60), such as those described above, which constitute the immersion exposure apparatus 100. The main controller 22 can be configured to separately control the supply of power to, for example, the substrate stage mechanism STM, the immersion unit IMU, and the illumination system 60.

The main controller 22 is configured to receive a power-off request from an operation unit and/or an external device (not shown). In this case, the power-off request can be, for example, a request to turn off the main power switch of the immersion exposure apparatus 100. Alternatively, the power-off request can be a request to shut off the supply of power to a plurality of units (e.g., the substrate stage mechanism STM, the immersion unit IMU, and the illumination system 60), constituting the immersion exposure apparatus 100, altogether or separately.

Upon receiving a power-off request, the main controller 22 shuts off the supply of power to a plurality of units in accordance with the request. At this time, the main controller 22 does not shut off the supply of power to at least the immersion unit IMU, until it is determined that the recovery of the liquid 42 from the surface of the substrate 44 or the substrate stage 52, by the immersion unit IMU, is complete up to a target level. In this case, the target level can be a level at which all the liquid is recovered or a level at which no practical problem occurs.

The liquid recovery unit 40 has a recovery path 40a, which recovers the liquid 42 on the substrate 44 or the substrate stage 52. The immersion controller 28 can determine the end of the recovery of the liquid on the basis of the flow rate of the liquid flowing in the recovery path 40a. For example, a flow rate sensor 38 placed in the recovery path 40a can detect the flow rate of the liquid flowing in the recovery path 40a.

When, for example, the flow rate of the liquid flowing in the recovery path 40a keeps below a reference flow rate for a reference period of time or more, the immersion controller 28 determines that the recovery of the liquid 42 from the surface of the substrate 44 or the substrate stage 52 has reached the target level. The immersion controller 28 then notifies the main controller 22 of the determination result. In this case, the reference flow rate and the reference time can be set to 1.0 ml/s and 3 sec, respectively. However, they can be set to arbitrary values.

Alternatively, based on the amount of liquid supplied by the liquid supply unit 36 and the amount of liquid recovered by the liquid recovery unit 40, the immersion controller 28 can determine that the recovery of the liquid has reached the target level.

Consider, for example, a case in which, while a liquid is fed out from the liquid supply unit 36 at a constant flow rate, the liquid recovery unit 40 recovers the liquid so as to circulate the liquid supplied, which is determined by the time during which the liquid is circulated, and the integrated quantity of liquid recovered by the liquid recovery unit 40, it can be determined that the recovery of the liquid has reached the target level. It suffices to obtain the amount of liquid supplied by the liquid supply unit 36 by integrating the flow rate detected by a flow rate sensor 61 provided in a liquid supply path 36a of the liquid supply unit 36, as exemplified by FIG. 2.

Figure 3:
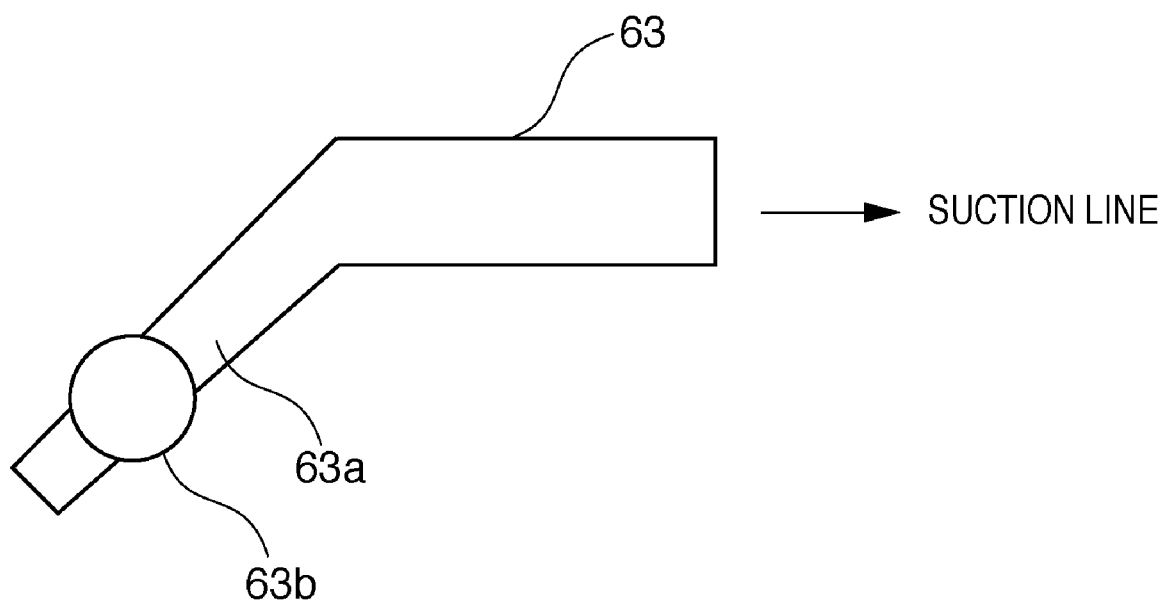
FIG. 3 is a view schematically showing an example of the arrangement of an emergency recovery unit.

As exemplified by FIG. 2, the immersion unit IMU preferably includes an emergency recovery unit 63, which recovers the liquid 42 from the surface of the substrate 44 or the substrate stage 52 at the time of the emergency. FIG. 3 is a view schematically showing an example of the arrangement of the emergency recovery unit 53. The emergency recovery unit 53 has an emergency recovery path 63a, which is connected to a suction line (typically, a vacuum line at a factory facility), to recover a liquid at the time of the emergency, and an emergency relief valve 63b, which is placed in the emergency recovery path 63a, to open at the time of an emergency. The emergency relief valve 63b opens when the supply of power to the emergency recovery unit 63 is shut off, and keeps closed while power is supplied.

Providing the emergency recovery unit 63 for the immersion exposure apparatus 100 (immersion unit IMU) can reduce the influence of the leakage of a liquid even in a case in which the supply of power to the immersion exposure apparatus 100 or the immersion unit IMU is shut off due to a power failure, or the like, without any notice.

If, for example, the immersion controller 28 determines that the recovery of the liquid 42 on the substrate 44 or the substrate stage 52 does not reach the target level within a set time, the immersion controller 28 can cause the emergency recovery unit 63 to recover the liquid. This operation can be performed by, for example, shutting off the supply of power to the emergency relief valve 63b.

Upon receiving an emergency off request (EMO) for power supply from an operation unit and/or an external device (not shown), the main controller 22 causes the liquid supply unit 36 to stop supplying the liquid. In addition, the main controller 22 is preferably configured to shut off the supply of power to at least the immersion unit IMU after the elapse of a preset wait time (e.g., 1 sec), upon receiving an emergency off request (EMO).

An off request and an emergency off request are distinctively used. A simple off request (normal off request) is a request without an emergency, and an emergency off request is a request with an emergency. When the main controller 22 receives an emergency off request, since the liquid recovery unit 40 can continue operation during the above preset wait time, all or part of the liquid can be recovered by the liquid recovery unit 40.

The main controller 22 is preferably configured such that when an emergency off request (EMO) is received, the supply of power to the substrate stage mechanism STM is shut off after the elapse of a preset wait time (e.g., 1 sec). This makes it possible to reduce the possibility of collision between the substrate stage 52 or a substrate and the projection optical system 2 after power-off, by moving the substrate stage 52 to a retreat position.

The main controller 22 can determine control of the substrate stage 52 during a wait time in accordance with the state of the immersion exposure apparatus 100 or substrate stage 52 upon reception of an emergency off request.

The immersion exposure apparatus 100 can be configured to comprise a plurality of power supply systems, which supply power to a plurality of units (e.g., the substrate stage mechanism STM, the immersion unit IMU, and the illumination system 60), respectively. In this case, the immersion exposure apparatus preferably comprises a diagnostic unit 95 which diagnoses the plurality of power supply systems.

One of the plurality of power supply systems can be configured to supply power to a block including the immersion unit IMU (this block will be referred to as a specific block). The specific block may include the substrate stage mechanism STM.

Figure 4:
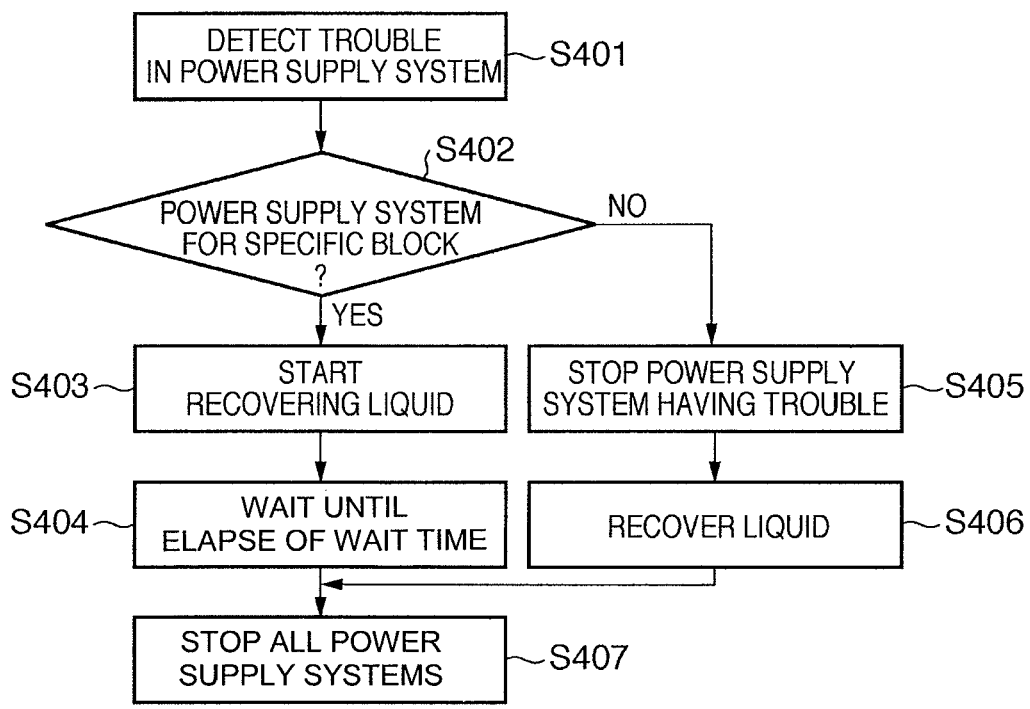
FIG. 4 is a flowchart showing an example of control performed by a main controller for a plurality of power supply systems.

FIG. 4 is a flowchart showing an example of control of the plurality of power supply systems by the main controller 22. Consider first a case in which the diagnostic unit 95 has determined that a power supply system, other than the power supply system which supplies power to the specific block, has trouble. In this case, the main controller 22 causes the power supply system having the trouble to stop supplying power, and causes the power supply system which supplies power to the specific block to keep supplying power until at least the recovery of a liquid by the immersion unit IMU is complete. On the other hand, if the diagnostic unit 95 determines that the power supply system, which supplies power to the specific block has trouble, the main controller 22 causes the power supply system, which supplies power to the specific block, to stop supplying power after the elapse of a preset wait time.

A more concrete example of control of the plurality of power supply systems by the main controller 22 will be described below with reference to FIG. 4. The main controller 22 starts this control when the diagnostic unit 95 detects in step S401 that at least one of the plurality of power supply systems has trouble (typically, a failure). The presence/absence of trouble can be detected by monitoring the voltage of the power supply line of each power supply system. If, for example, there is a variation in the voltage that exceeds an allowable range, it can be determined that the corresponding power supply system has trouble.

In step S402, the main controller 22 determines whether the power supply system, in which the trouble is detected by the diagnostic unit 95, is the power supply system for supplying power to the specific block.

If the power supply system, in which the trouble has been detected, is the system for the specific block, the main controller 22 causes the system to wait for a preset wait time before shutting off the supply of power to the specific block. In step S403, the main controller 22 causes the immersion unit IMU of the specific block to start recovering the liquid, so as to recover the liquid during this wait time. If the specific block also includes the substrate stage mechanism STM, the main controller 22 causes the substrate stage mechanism STM to operate as well as the immersion unit IMU. This operation can include the operation of moving the substrate stage 52 to the retreat position and the operation of moving the substrate stage 52 to a position suitable for the recovery of the liquid.

In step S404, the main controller 22 waits until the elapse of the wait time. The process then advances to step S407.

If the power supply system, in which the trouble has been detected, is a system (e.g., the illumination system 60) for a block other than the specific block, the main controller 22 causes the power supply system having the trouble to stop supplying power, in step S405.

In step S406, the main controller 22 causes the power supply system, which supplies power to the specific block, to keep supplying power to the specific block at least until the recovery of the liquid by the immersion unit IMU is complete. This allows the liquid recovery unit 40 of the specific block to recover the liquid. The main controller 22 then advances the process to step S407.

Note that the above description has exemplified the immersion exposure apparatus of the local fill scheme. However, the present invention can also be applied to an immersion exposure apparatus of a scheme of immersing an entire substrate in a liquid.

A device manufacturing method according to the preferred embodiments of the present invention is suitable for the manufacture of devices (e.g., a semiconductor device and a liquid crystal device). This method can include a step of exposing a substrate coated with a photoresist to light by using an exposure apparatus, and a step of developing the substrate exposed in the exposing step. In addition to the above steps, the device manufacturing method can include other known steps (e.g., oxidation, film forming, evaporation, doping, planarization, etching, resist removal, dicing, bonding, and packing steps).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. An exposure apparatus that includes a projection optical system configured to project a pattern of an original onto a substrate via a liquid to expose the substrate to light, the apparatus comprising:
    a stage mechanism including a stage configured to hold the substrate;
    an immersion unit configured to supply a liquid to a gap between (i) one of the substrate and the stage and (ii) the projection optical system, and to recover the liquid from the gap; and
    a controller configured, if the controller receives an emergency shut off request, to shut off power supply to the immersion unit after an elapse of a preset wait time such that at least a part of the liquid is recovered from the gap by the immersion unit.

2. A method of manufacturing a device, the method comprising:
    (A) exposing a substrate to light using an exposure apparatus;
    (B) developing the exposed substrate; and
    (C) processing the developed substrate to manufacture the device,
    wherein the exposure apparatus comprises:
        (a) a projection optical system configured to project a pattern of an original onto the substrate via a liquid to expose the substrate to light;
        (b) a stage mechanism including a stage configured to hold the substrate;
        (c) an immersion unit configured to supply a liquid to a gap between (i) one of the substrate and the stage and (ii) the projection optical system, and to recover the liquid from the gap; and
        (d) a controller configured, if the controller receives an emergency shut off request, to shut off power supply to the immersion unit after an elapse of a preset wait time such that at least a part of the liquid is recovered from the gap by the immersion unit.

3. An exposure apparatus that includes a projection optical system configured to project a pattern of an original onto a substrate via a liquid to expose the substrate to light, the apparatus comprising:
   a stage mechanism including a stage configured to hold the substrate;
   an immersion unit configured to supply a liquid to a gap between (i) one of the substrate and the stage and (ii) the projection optical system, and to recover the liquid from the gap; and
   a controller configured, if the controller receives an emergency shut off request, to shut off power supply to the immersion unit after determining that at least a part of the liquid in the gap is recovered by the immersion unit.

4. An apparatus according to claim 3, wherein the immersion unit includes a recovery path configured to recover the liquid from the gap, and the controller is configured to perform the determination based on a flow rate of the liquid flowing in the recovery path.

5. An apparatus according to claim 3, wherein the controller is configured to perform the determination based on an amount of liquid supplied to the gap and an amount of liquid recovered from the gap.

6. An apparatus according to claim 3, further comprising:
   a diagnostic unit configured to diagnose a power supply system that supplies power to the immersion unit,
   wherein the controller is configured, if the controller receives the emergency shut off request and the diagnostic unit does not determine that the power supply system has trouble, to shut off power supply of the power supply system to the immersion unit after determining that at least a part of the liquid in the gap is recovered by the immersion unit.

7. A method of manufacturing a device, the method comprising:
   (A) exposing a substrate to light using an exposure apparatus;
   (B) developing the exposed substrate; and
   (C) processing the developed substrate to manufacture the device,
   wherein the exposure apparatus comprises:
      (a) a projection optical system configured to project a pattern of an original onto the substrate via a liquid to expose the substrate to light;
      (b) a stage mechanism including a stage configured to hold the substrate;
      (c) an immersion unit configured to supply a liquid to a gap between (i) one of the substrate and the stage and (ii) the projection optical system, and to recover the liquid from the gap; and
      (d) a controller configured, if the controller receives an emergency shut off request, to shut off power supply to the immersion unit after determining that at least a part of the liquid in the gap is recovered by the immersion unit.

* * * * *